United States Patent [19]

Sakaki

[11] Patent Number: 5,054,030
[45] Date of Patent: Oct. 1, 1991

[54] GRID-INSERTED QUANTUM STRUCTURE

[75] Inventor: Hiroyuki Sakaki, Yokohama, Japan

[73] Assignee: Research Development Corporation of Japan, Tokyo, Japan

[21] Appl. No.: 464,498

[22] Filed: Jan. 12, 1990

[30] Foreign Application Priority Data

Nov. 13, 1989 [JP] Japan .................................. 1-294368

[51] Int. Cl.⁵ ............................................... H01S 3/19
[52] U.S. Cl. ......................................... 372/45; 372/46; 372/50
[58] Field of Search ........................ 372/44, 45, 46, 50

[56] References Cited

U.S. PATENT DOCUMENTS 4,843,032 6/1989 Tokuda et al. ......................... 372/45
4,868,839 9/1989 Simmons et al. ....................... 372/50

FOREIGN PATENT DOCUMENTS 0179592 7/1988 Japan ..................................... 372/45

OTHER PUBLICATIONS

1989 American Institute of Physics, "Formation of Planar Superlattice States in New Grid-Inserted Quantum Well Structures", Appl. Phys. Lett. 54 (14), 3 Apr. 1989, pp. 1326, 1327, 1328.

Primary Examiner—Georgia Epps
Attorney, Agent, or Firm—Armstrong, Nikaido, Marmelstein, Kubovcik & Murray

[57] ABSTRACT

A grid-inserted quantum structure which exhibits a quantum size effect and in which a material (3), (4) dissimilar to that of a confining layer (1) having a high level of electron affinity is disposed on both sides or one side of the confining layer (1), comprises grids (2) which are composed of a dissimilar material having an attraction potential or a repulsion potential and which are disposed at equal intervals. This structure enables electrons to be captured in regions without the grids (2) or around the grids (2) owing to the interaction between the electrons and the grids (2) in the confining layer (1). Further, the effective function of the potential of the grids (2) enables the same effect as that obtained by several tens atomic layers of a dissimilar material to be obtained by one or several atomic layers.

7 Claims, 7 Drawing Sheets

FIG. 7
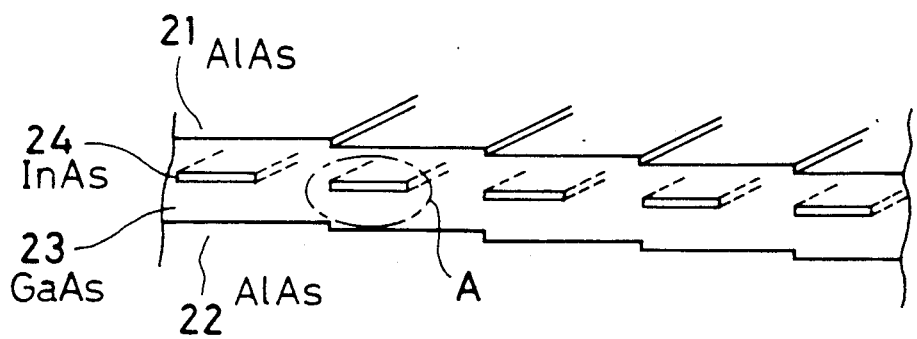
FIG. 8
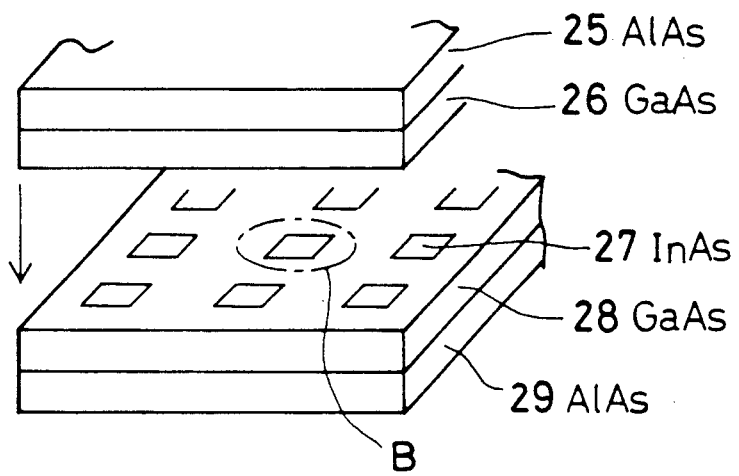
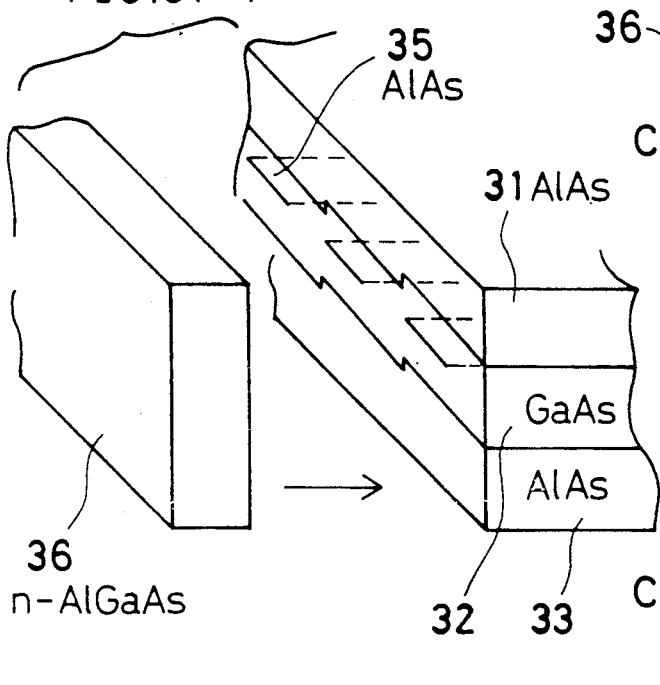
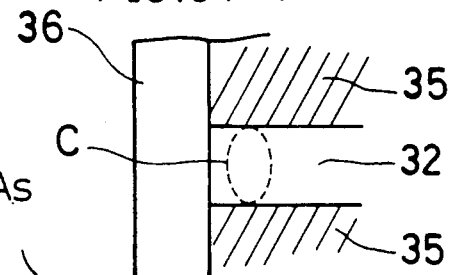
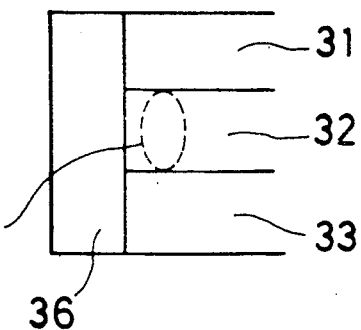

GRID-INSERTED QUANTUM STRUCTURE

BACKGROUND OF THE INVENTION

The present invention relates to a grid-inserted quantum structure which is used as an element for controlling electrons or light.

Elements which employ quantum structures such as quantum well lasers, quantum box lasers, quantum wire lasers (transistors) and the like have been proposed as devices employing new ideas which utilize the techniques of growing structures such as the molecular beam epitaxy method and the organometallic CVD method.

A quantum well laser is designed with an active layer having a quantum structure with a thickness (of about 100 Å) substantially the same as the de Broglie wavelength $\lambda$ of electrons so that electrons can be captured in a quantum manner in the direction of the thickness and can behave as free particles only in the two-dimensional directions along the thickness of the layer. Such a quantum well laser is characterized in that the oscillation wavelength can be controlled by controlling the structure, e.g., the thickness of the layer, and excellent oscillation characteristics can be obtained at a threshold current value.

In the above-described quantum well laser in which electrons are captured in a quantum manner in the direction (z) of the thickness of the structure, electrons are further captured in a quantum manner in the two-dimensional directions (x, y) along the thickness to form a quantum box layer. Electrons are captured in a quantum manner in either of the directions to form a quantum wire laser.

In order to realize a device employing the above-described structure, it is necessary to reduce the size of the quantum wire and box. Although it is preferable that the crystal structure has a size of several hundred Å or less, generally 500 Å or less, it is difficult to form such a device by using conventional electron beams or fine processing.

FIG. 1 is a drawing of an example of a two-dimensional step structure; FIG. 2, a drawing for explaining a method of forming a periodic step structure; FIG. 3, a drawing for explaining a method of forming a quantum well device using the method of growing a crystal; and FIG. 4, a drawing of an example of a quantum well device in which crystals having different compositions are formed in the longitudinal direction. In these drawings, reference numeral 21 denotes a substrate; reference numeral 22, a structure; reference numerals 23, 24, barrier layers, and reference numeral 25, a confining layer.

In FIG. 2, the substrate 21 is composed of, for example, a GaAs crystal, which is polished at a specific angle $\phi$ in a specific direction to obtain a periodic step structure as shown in the drawing. Assuming that a layer comprising atoms each denoted by O is formed, a step structure with steps each having a thickness corresponding to one atomic layer is formed by polishing the layer so as to scrape off atoms each denoted by O shown by a dotted line. That is, as a single atom cannot be partially polished, the atoms which are partially subjected to polishing (denoted by 0 shown by a dotted line) are scraped off to form a step on the atomic unit. Thus, the width of a step depends upon the polishing angle in such a manner that the width decreases as the angle $\phi$ increases and, contrarily, it increases as the angle decreases. For example, the angle $\phi$ and the step width $\Lambda$ have the following relation:

| $\Phi$ | (°) | 0.5 | 0.8 | 1 | 1.6 | 2 |
|---|---|---|---|---|---|---|
| $\Lambda$ | (Å) | 320 | 200 | 160 | 100 | 80 |

It is also possible to form the two-dimensional step structure shown in FIG. 1 by appropriately selecting the directions of polishing.

On the thus-formed substrate 21 are deposited material A and material B, as shown in FIG. 3, to form a crystal having different compositions in the longitudinal direction. In other words, when the material A is first deposited in a thickness corresponding to several atoms, since the material is bonded to the lower and side surfaces at the corner of each step, the crystal successively grows from the corner In this way, a confining layer 25 can be formed between barriers 23, 24 each serving as an electron-capturing layer, as in the structure shown in FIG. 4.

In the above-described crystal, however, it is necessary to stack, for example, the material A on the same material A over a thickness corresponding to 30 to 40 atomic layers. However, there is a problem in that a plurality of atomic layers cannot be easily placed on the same material, and such atomic layers cannot be easily deposited unless the controllablity of deposition is improved. It is also difficult to form a quantum box structure.

SUMMARY OF THE INVENTION

It is an object of the present invention to improve a stacking effect so as to obtain a controlling effect of electron state by using quantum size effect.

It is another object of the present invention to enable electrons to be captured in a simple quantum wire structure.

It is still another object of the present invention to realize a quantum box structure with a simple structure.

To these ends, the present invention provides a quantum structure which exhibits a quantum size effect and which comprises confining layers having a high level of electron affinity and layers which are made of a material dissimilar to that of the confining layers and which are disposed on both sides or on one side of the confining layers, grids composed of a dissimilar material having an attraction potential or a repulsion potential being disposed at equal intervals. The present invention is further characterized in that the grids are disposed so as to be buried in a linear, island or network (mesh) form in the structure by using the substrate shown in FIGS. 1 and 2 which is polished at an angle, and in that material which is the same as that of the doping layer and the confining layer or layers of that material and a dissimilar material are disposed on the sides of the structure. Alternatively, grids are disposed at equal intervals on the sides of the structure and material which is the same as that of the confining layer or layers of that material and a dissimilar material are disposed on the grids.

The above-described structure in which grids having an attraction potential or a repulsion potential and composed of a dissimilar material are disposed at equal intervals enables electrons to be captured in a region without grids or around the grids owing to the interaction between the electrons and the grids in the structure. In addition, the effective potential function of the grids enables with one or several atomic layers the achievement of the same effect as that obtained by a crystal comprising several tens of atomic layers of a dissimilar material.

Still other objects and advantages of the present invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 7 is a drawing of an example using linear grids each having an attraction potential;

FIG. 8 is a drawing of an example using rectangular grids each having an attraction potential;

FIGS. 9(a)-9(c) are drawings of examples of a quantum box having a composite structure which employs an electrically conductive layer formed at a junction boundary;

DESCRIPTION OF PREFERRED EMBODIMENTS

Embodiments will be described below with reference to the drawings.

Figure 5:
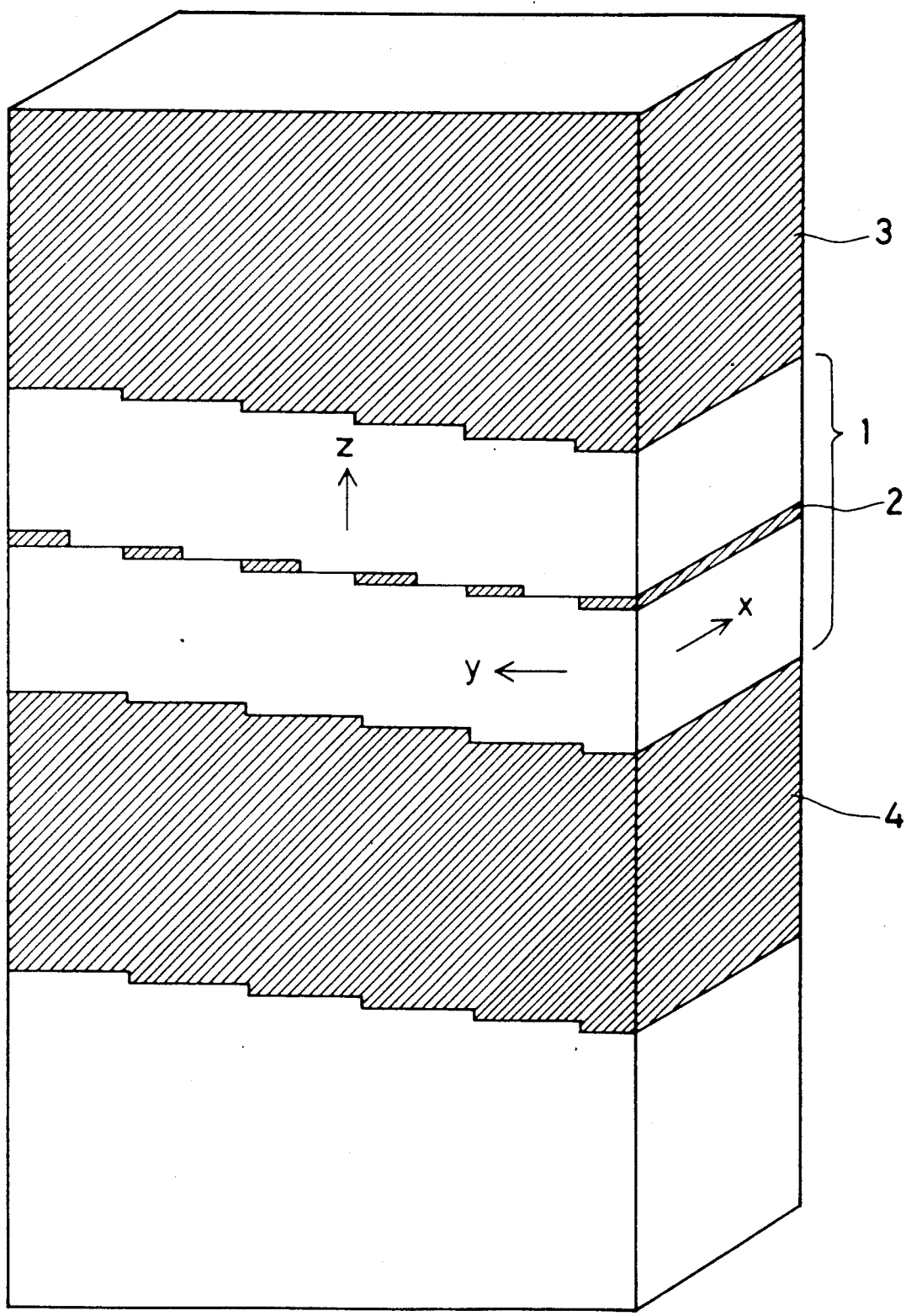
FIG. 5 is a drawing of an embodiment of a grid-inserted quantum structure in accordance with the present invention.

In FIG. 5, reference numeral 1 denotes a confining layer; reference numeral 2, grids; and reference numerals 3 and 4, barrier layers. The confining layer 1 comprises 30 to 40 atomic layers and has the grids 2 having a composition, which is different from that of the atomic layer 1, in the vicinity of the center thereof. The confining layer 1 may have any structure which can capture electrons. For example, when a selective doping technique or a gate electrode is used, a conduction channel electrostatically formed at the junction portion between (AlGa)As and GaAs may be used as the confining layer 1. The grids 2 are disposed at intervals which are closed to a value which allows the occurrence of an effect based on quantum mechanics so that electrons can freely move in the confining layer 1 with a certain limitation. In other words, since the potential of the grids 2 is high in the confining layer 1, electrons are concentrated in regions without the grids 2, and the accumulation of electrons is determined by the facilitation of the movement of electrons by the grids 2.

Figure 1:
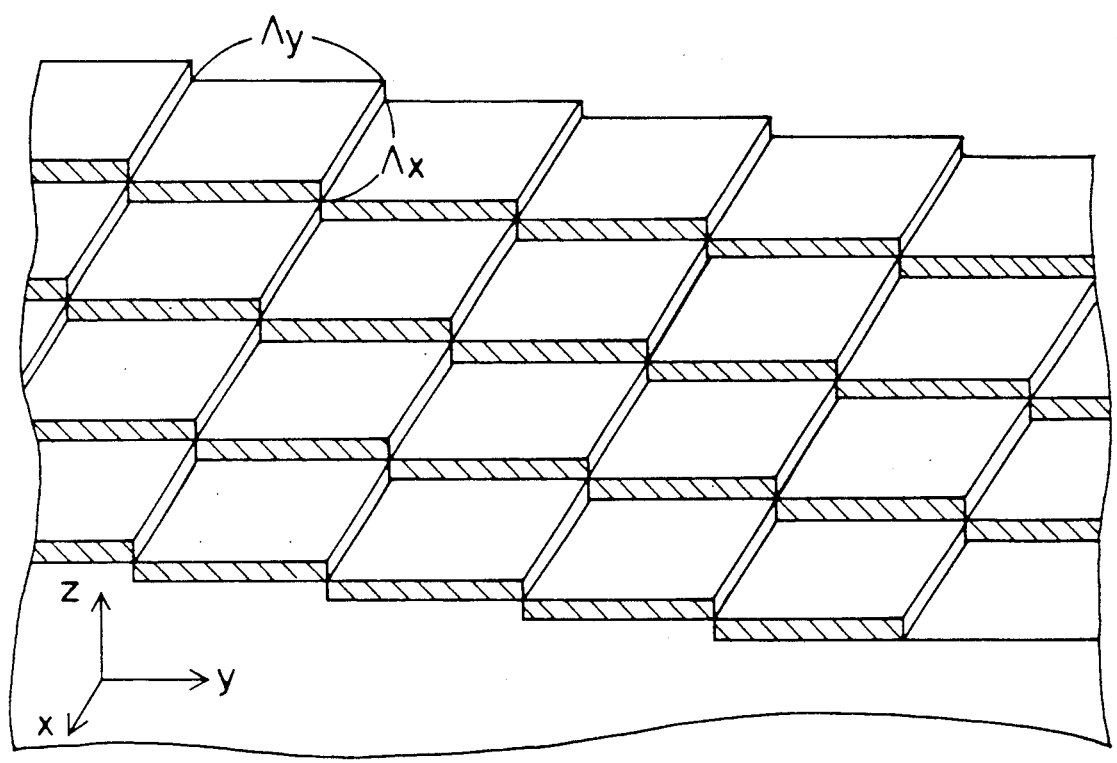
FIG. 1 is a drawing of an example of a two-dimensional step structure.

Namely, in the structure shown in FIG. 1, electrons easily flow in the direction x along the grids 2 and flow with difficulty in the direction y vertical to the grids 2 in each of the white region's shown in the drawing, thereby forming quantum wires. Further, the degree of fineness varies with a change in the width or thickness of the grids 2. The barrier layers 3, 4 have the function of forming an electron-capturing layer.

Figure 2:
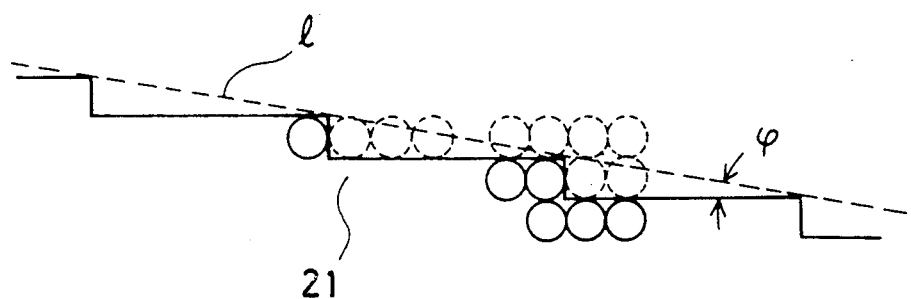
FIG. 2 is an explanatory drawing of a method of producing a periodic step structure.
Figure 3:
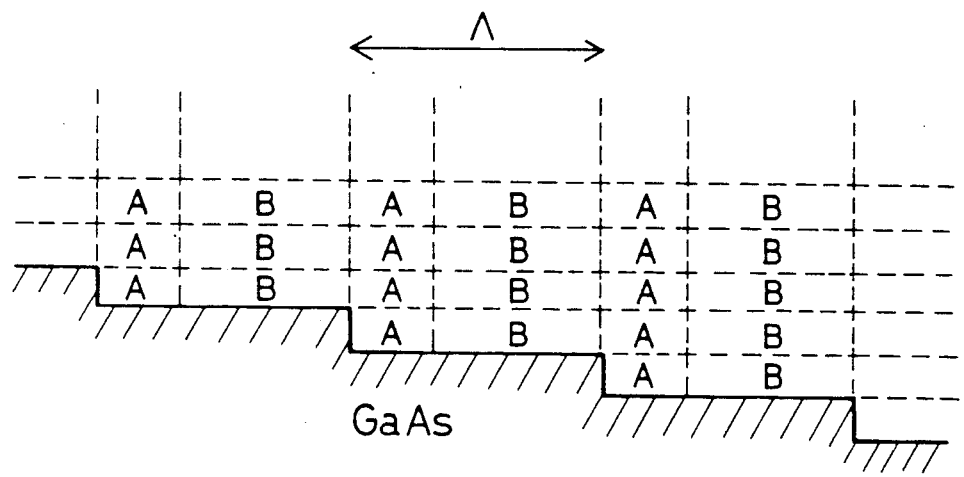
FIG. 3 is an explanatory drawing of a method of producing a quantum well device using a crystal growth method.
Figure 4:
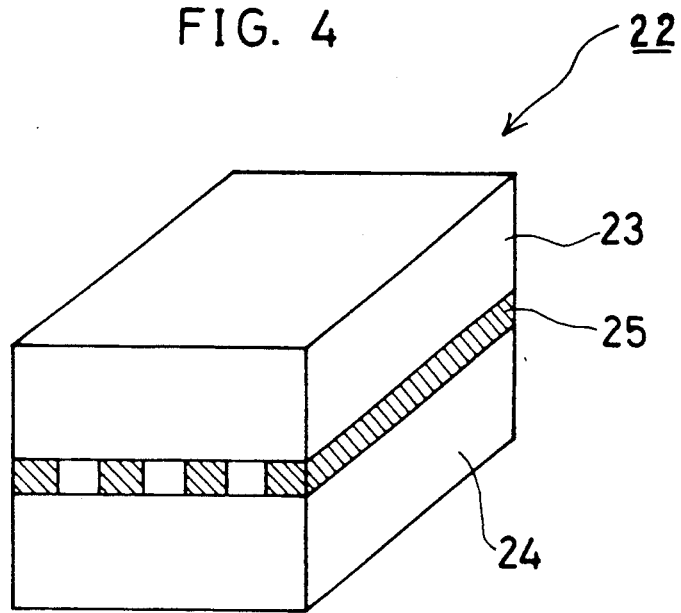
FIG. 4 is a drawing of an example of a quantum well device in which crystals having different compositions are formed in the longitudinal direction.

The confining layer 1 is in a relatively simple form as compared with the conventional structure shown in FIG. 13 and is formed by growing a crystal on the barrier layer 3 by using the material which is the same as that of the barrier layer 3, placing a dissimilar material with a thickness of about 1 to 10 layers substantially at the center, and then growing a crystal thereon by using the same material to stack atomic layers having a given thickness. For example, if 30 to 40 atomic layers are formed, a remarkable effect can be obtained by inserting a dissimilar material atomic layer comprising 1 to 10 layers. As described above with reference to FIGS. 2 and 3, it is difficult to stack 30 to 40 atomic layers in the longitudinal direction by using a dissimilar material to grow a crystal, while it is significantly easy to enter the grids 2 comprising 1 to 10 atomic layers substantially at the center, as shown in FIG. 1. Since the grids 2 have a potential which is higher than that of the periphery thereof, for example, the potential corresponds to about 50 to 100 meV obtained from only one atomic layer, it is possible to expect a remarkable effect of capturing electrons which equals to the effect obtained by a crystal structure formed by stacking 30 to 40 atomic layers in the longitudinal direction using a dissimilar material. The grids 2 also allow the characteristics to be freely changed by changing the width or thickness thereof.

Although the grids are disposed in one direction in the above-described embodiment, grids may be provided in two directions (mesh form), i.e., the directions x and y, the directions x and z or the directions y and z, or may be provided in multiple layers or in the three-dimensional directions.

The above-mentioned grid-inserted quantum structure can be applied to various devices, as shown in FIG. 6. In FIG. 6, reference numerals 11 and 12 each denote an electrode; reference numeral 13, a gate; reference numeral 14, a grid-inserted quantum structure; reference numeral 15, a p-layer; and reference numeral 16, an n-layer.

Figure 6A:
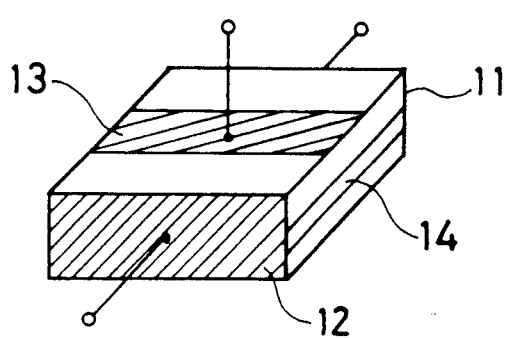
FIGS. 6(a)-6c) are drawings of examples of configurations of a quantum structure device using a grid-inserted quantum structure.
Figure 6B:
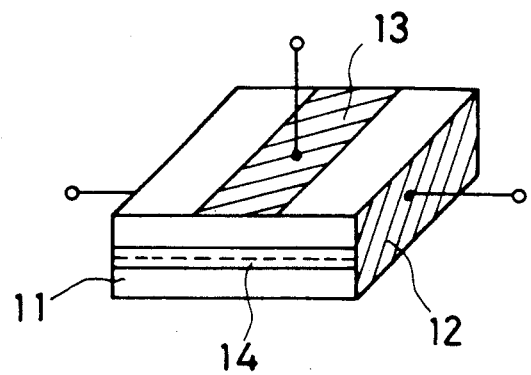

For example, an FET in the form of a quantum wire can be formed by providing the electrodes 11, 12 on the surfaces vertical to the grids of the grid-inserted quantum structure 14 and the gate 13 on the upper surface thereof, as shown in FIG. 6(a). The grid-inserted quantum structure can be applied to a gate control superlattice by changing the positions of the electrodes 11, 12 and the gate 13, as shown in FIG. 6(b). Although no current generally easily flows in the transverse direction of the grids, a current flows in that direction with a certain degree of probability if the grids are made fine. This property is employed in the gate control superlattice in which a negative resistance is produced or no current flows owing to the Bragg reflection when the wavelength of electrons agrees with the wavelength of the superlattice. In such a structure, since the optical absorption characteristics are changed when the number of electrons is changed by the function of the gate electrode, the use of this phenomenon enables a light modulator to be realized.

Figure 6C:
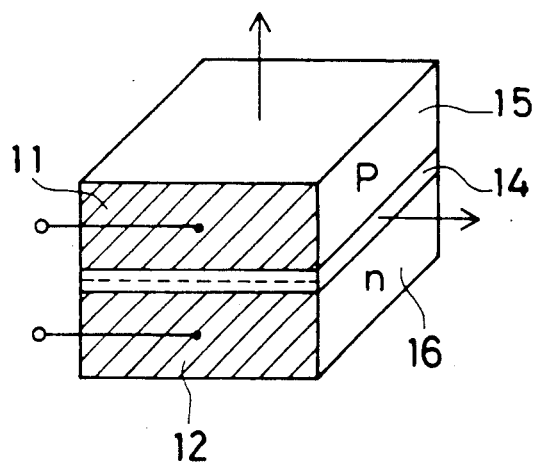

FIG. 6(c) shows an example in which the grid-inserted quantum structure is applied to a laser or LED (light emission diode) in which the grid-inserted quantum structure 14 is interposed between the p-layer 15 and the n-layer 16. Excellent characteristics can be obtained from the grid-inserted quantum structure 14 if the structure is applied to a laser or LED because electrons are captured.

Figure 6D:
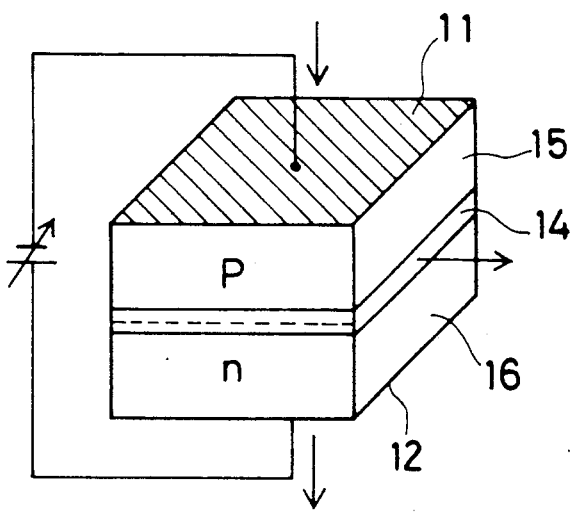

In addition, the dependency of light absorption coefficients on the wavelength is shifted to the side of long wavelengths in the grid-inserted quantum structure 14 disposed at the p-n junction if a reverse bias is applied thereto, while the absorption coefficients are not in a stepwise form but discrete form in a quantum box. The grid-inserted quantum structure can be thus used as a modulator or an optical switch when configured as shown in FIG. 6(d) and enables various types of modulation in various wavelength regions.

Figure 6E:
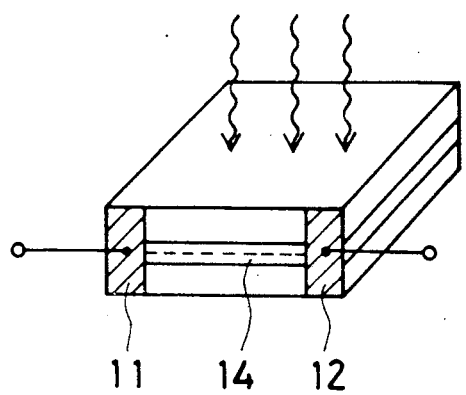

FIG. 6(e) shows an example of a configuration in which the grid-inserted quantum structure is applied to a detector for infrared light. In the grid-inserted quantum structure 4, the state wherein electrons are captured is a standing-wave state. Although a standing wave stands in the direction vertical to the film in a conventional film structure, if a film is in a grid or mesh form, a standing wave also stands in the directions of a grid or mesh, i.e., a standing wave stands in the direction z vertical to the film as well as the directions x or/and y of the film surface. Since the quantum structure has the property that, if light enters between states of a standing wave having one crest and having two crests, the state of electrons is shifted, the use of this property enables the application to a light detector. Although light must be entered along the film surface in a conventional structure because a standing wave stands only in the direction z in a conventional structure, the grid-inserted quantum structure 14 can be used as a light detector which shows displacements and changes in the conductance in the directions x and y because a standing wave is present in either the direction x or y even if light is entered in the vertical direction.

As described above, the grid-inserted quantum structure of the present invention comprises the confining layer, for example, composed of GaAs, having strong electron affinity, the barrier layers composed of a material which is dissimilar to GaAs, for example, AlAs, and the grids composed of a dissimilar material which are buried in the atomic layer so that electrons are captured. The grids may be composed of AlAs having a repulsion potential, as well as a dissimilar material having an attraction potential, e.g., InAs.

Another embodiment of the present invention will be described below.

In FIG. 7, a material having an attraction potential, for example, InAs, is used for grids 24. The above-described AlAs exerts a repulsion force on electrons so as to capture the electrons between the respective grids, while InAs exerts an attraction force on electrons so as to gather in the regions around the grids, whereby the electrons can be captured in an elliptical region A denoted by a one-dot chain line. In the case of the grid-inserted quantum structure shown in FIG. 7, therefore, electrons are captured in a linear form around each of the grids 24.

The grid-inserted quantum structure in the example shown in FIG. 8 is formed by burying rectangular InAs grids 27 in an island-like form in a laminate comprising an AlAs barrier layer 29 and a GaAs confining layer 28, and laminating a GaAs confining layer 26 and an AlAs barrier layer 25 on the grids 27. In this case, electrons can be captured in an elliptical region B shown by a one-dot chain line by using as the grids 27 InAs having an attraction potential in the same way as in FIG. 7, to form a quantum box.

FIG. 9 shows an examples of a quantum box in a composite structure which employs the same principle as an HEMT (high electron mobility transistor). This utilizes the property that, when n-AlGaAs is grown on high-purity GaAs, electrons are accumulated at the boundary therebetween to form an electrically conductive layer. In the drawing, a confining layer 32 is composed of high-purity GaAs and contains AlAs grids 35 buried therein, with AlAs barrier layers 31, 33 being grown on the upper and lower surface of the confining layer to form a Sandwich structure, and an n-AlGaAs covering layer 36 being grown on a section from which the grids are exposed and which is at right angles or a certain angle with respect to the confining layer 32 and the grids 35. In this structure, as shown in the upper sectional view in FIG. 9(b) and the cross-sectional view in FIG. 9(c), electrons are captured in a region denoted by a dotted line C at the boundary between the atomic layer 32 and the n-AlGaAs covering layer 36 in an intermediate portion of the grids 35 in the confining layer 32, to form a quantum box. FIGS. 10 and 11 respectively show examples of methods of manufacturing a grid-inserted quantum structure in such a composite structure.

Figure 10A:
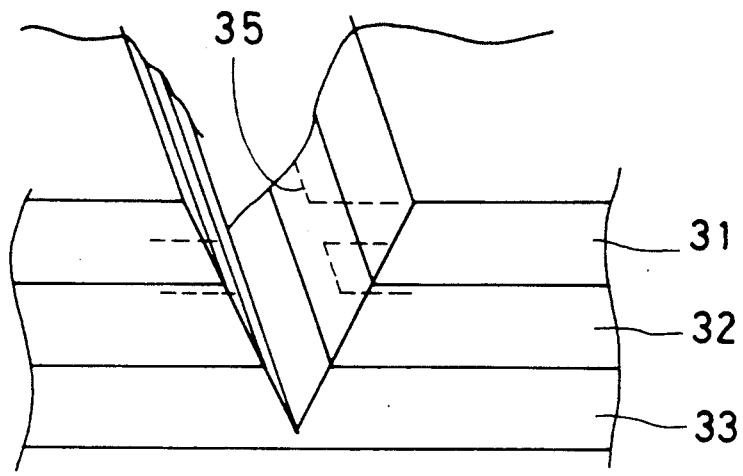
FIGS. 10(a)-10(b) and 11 are explanatory views of a method of producing a quantum box.
Figure 10B:
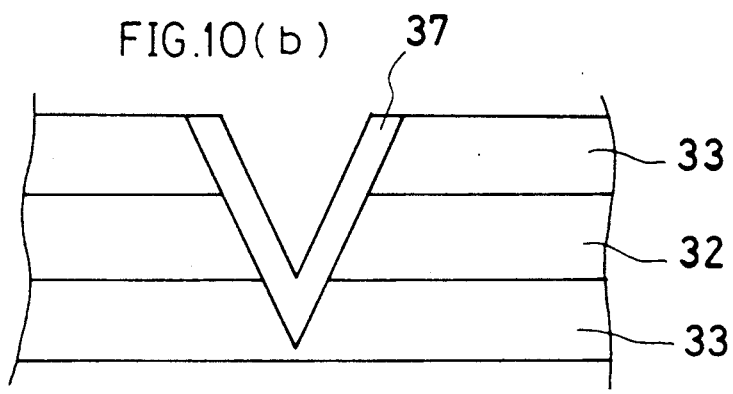
Figure 11:
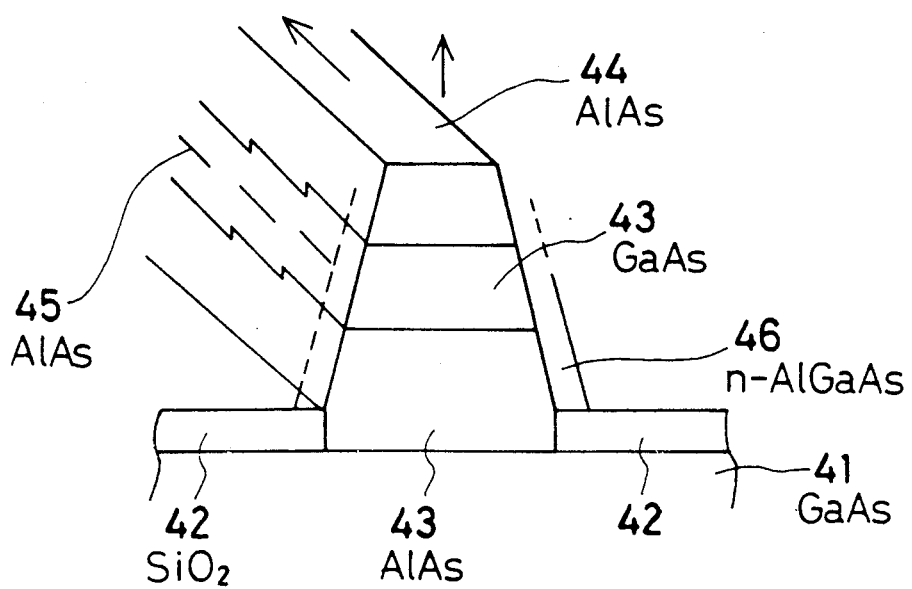

In the manufacturing method shown in FIG. 10, a barrier layer 33, a confining layer 32 in which grids 35 are buried and a barrier layer 31 are first grown, a V-shaped notch is then formed, as shown in FIG. 10(a), and an n-AlGaAs layer 37 is again grown on the cut surface, as shown in FIG. 10(b).

In the manufacturing method shown in FIG. 11, a SiO2 layer 42 is first formed on a GaAs substrate 41, and then an AlAs barrier layer 43 is selectively formed by using, for example, the MO-CVD method to form a projecting layer as shown in the drawing. Then, an AlAs grid-containing GaAs atomic layer 43 and an AlAs barrier layer 44 are grown on the barrier layer 43. Then, an n-AlGaAs covering layer 36 is grown on each of the sectional portions of the projecting layer. In this case, it is necessary to appropriately select the directions of the crystal. For example, it is preferable that the direction of the sectional portions of the projecting portion is the same as that of the [111] B plane, and the direction of the length is the same as or equivalent to the [110] plane. In addition, since it is necessary to form steps in the lengthwise direction, as shown in the drawing, it is also necessary to incline the substrate and appropriately select the direction of the crystal growth.

Figure 12A:
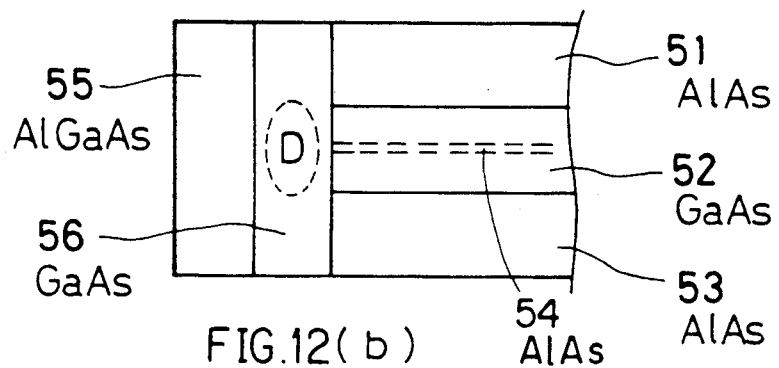
FIGS. 12(a)-12(b) and 13(a)-13(b) are drawings of other embodiments of a grid-inserted quantum structure employing a composite structure.
Figure 12B:
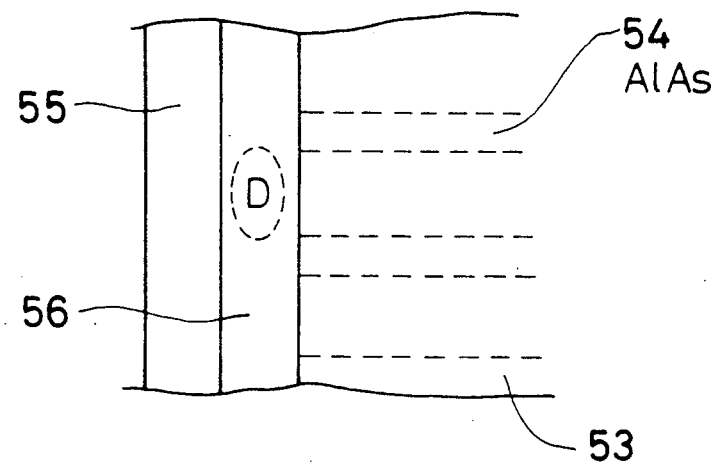

The grid-inserted quantum structure shown in FIG. 12 has a sandwich structure comprising barrier layers 51, 53 and a confining layer containing grids 54, which are composed of AlAs and GaAs, respectively, with a covering layer 56 composed of the same material as GaAs of the confining layer and grown on each sectional portion from which the grids 54 are exposed, and a covering layer 55 composed of AlGaAs grown on the outside of each covering layer 56. In this grid-inserted quantum structure, since the GaAs covering layer 56 in which electrons are easily present is provided at the end of the grids 54, electrons move in the atomic layer 52 toward the covering layer 56 and are captured. That is, electrons are easily concentrated and captured in a region without the grids 54 at the three-forked intersection between the GaAs confining layer 52 and the covering layer 56. This structure also causes a reduction in the interaction between the electrons and the grids 54. However, since the outer layer is not doped, not only electrons but also holes can be captured together. Since electrons as well as holes must be captured in the formation of a laser, the grid-inserted quantum structure is useful for forming a laser.

Figures 13A, 13B:
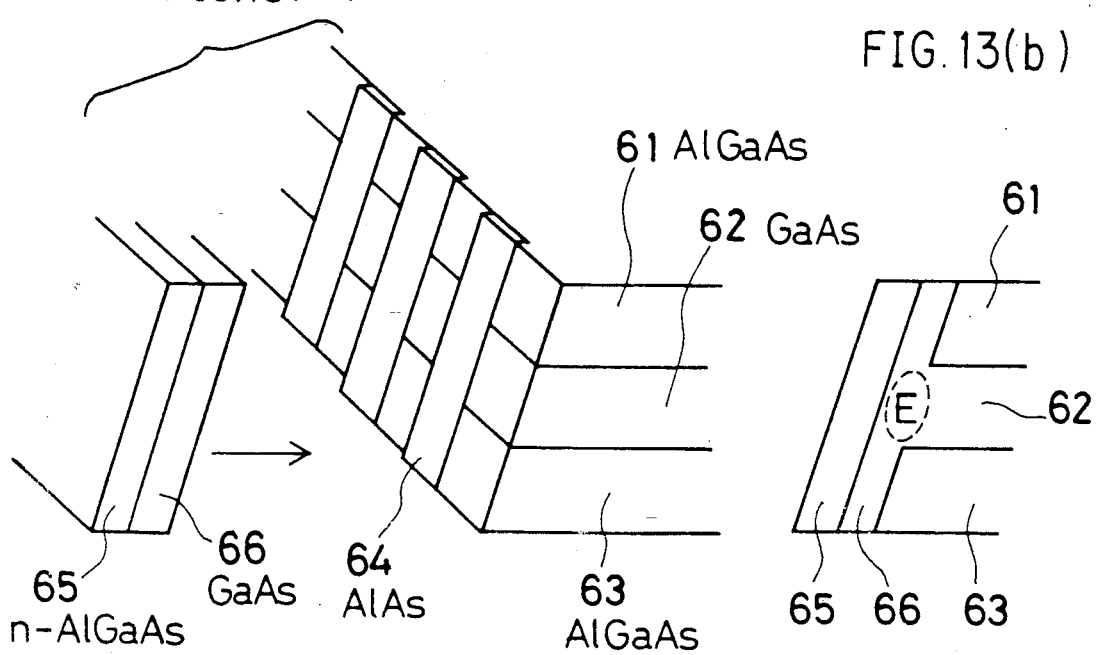

The grid-inserted quantum structure shown in FIG. 13 has a sandwich structure comprising barrier layers 61, 63 and a confining layer 62 without any grid, which are composed of AlGaAs and GaAs, respectively, with AlAs grids stepwisely buried in the longitudinal direction in the section which is slightly inclined as shown in the drawing, a GaAs confining layer 66 and an n-AlGaAs covering layer 65 provided in turn on the grids. This structure enables electrons to be captured in the three-forked portion (the region shown by a dotted line E in FIG. 13(a)) where the GaAs atomic layer without the AlAs grids 64 contacts with the covering layer 66.

Although each of the above-described embodiments of the present invention concerns a monolayer quantum structure, the present invention is not limited to these embodiments and can be changed to various forms such as a multilayer quantum structure or the like.

As seen from the above description, the present invention enables a change in the potential of the grids which are composed of a dissimilar material and are inserted at equal intervals in the structure and thus enables the same effect as that obtained by several tens atomic layers of a dissimilar material to be obtained by 10 or less atomic layers. Further, it is possible to perform various types of control by changing the arrangement of the grids and change the characteristics by changing the width and thickness thereof. In addition, the quantum structure can be easily manufactured because only 10 or less atomic layers may be stacked.

What is claimed is:

1. A grid-inserted quantum structure which exhibits a quantum size effect, comprising:
   a confining layer having a high level of electron affinity;
   a material dissimilar to that of said confining layer said material being disposed on at least one of both sides of said confining layer; and
   a plurality of grids disposed in substantially equal intervals in said confining layer, said grids having a material dissimilar from that of said confining layer, said grid material having one of an attraction and a repulsion potential.

2. A grid-inserted quantum structure according to claim 1, wherein said grids are buried in a network form in said structure.

3. A grid-inserted quantum structure according to claim 1, wherein said grids are buried in a linear form in said structure.

4. A grid-inserted quantum structure according to claim 1, wherein said grids are buried in an island-like form.

5. A grid-inserted quantum structure according to claim 1, wherein a doping layer is disposed on the sides of said structure.

6. A grid-inserted quantum structure according to claim 1, wherein a layer composed of the same material as that of said confining layer and a layer composed of said same material and a material dissimilar thereto are stacked on the sides of said structure.

7. A grid-inserted quantum structure according to claim 1, wherein grids are disposed at equal intervals on the sides of said structure and a layer composed of the same material as that of said confining layer and a layer composed of said same material and a material dissimilar thereto are stacked on said grids.

* * * * *

UNITED STATES PATENT AND TRADEMARK OFFICE
CERTIFICATE OF CORRECTION

PATENT NO. : 5,054,030

DATED : October 1, 1991

INVENTOR(S) : Hiroyuki SAKAKI

It is certified that error appears in the above-identified patent and that said Letters Patent is hereby corrected as shown below:

Column 2, line 19, delete "23, 24 each serving as", and insert therefor -- 23 and 24, containing --;

line 20, delete "an";

line 20, delete "layer,", and insert therefor -- regions, --.

Column 3, line 28, delete "6c)", and insert therefor -- 6(e) --;

line 61, delete "closed", and insert therefor -- close --.

Column 4, line 8, after "electron-capturing", insert -- region in the confining --;

line 11, delete "13", and insert therefor -- 3 --;

line 12, delete "by using the material which is the same";

line 13, delete "as that of the barrier layer 3";

line 47, delete "!5,", and insert therefor -- 15, --.

UNITED STATES PATENT AND TRADEMARK OFFICE
CERTIFICATE OF CORRECTION

PATENT NO. : 5,054,030
DATED : October 1, 1991
INVENTOR(S) : Hiroyuki SAKAKI

It is certified that error appears in the above-identified patent and that said Letters Patent is hereby corrected as shown below:

Column 6, line 38, delete "SiO2", and insert therefor -- $SiO_2$ --;

line 44, delete "36", and insert therefor -- 46 --;

line 57, after "layer", insert -- 52 --;

line 66, delete "atomic", and insert therefor -- confining --.

Column 7, line 21, delete "13(a))", and insert therefor -- 13(b)) --;

line 21, delete "atomic", and insert therefor -- confining --.

Signed and Sealed this

Fifth Day of July, 1994

Attest:

BRUCE LEHMAN

Attesting Officer     Commissioner of Patents and Trademarks